US009674965B1

(12) United States Patent
Salinger et al.

(10) Patent No.: US 9,674,965 B1
(45) Date of Patent: Jun. 6, 2017

(54) HYBRID BONDING TECHNIQUES FOR ELECTRONIC DEVICES

(71) Applicant: Amazon Technologies, Inc., Reno, NV (US)

(72) Inventors: Jeffrey Steven Salinger, Morgan Hill, CA (US); James Nelson Aldrich, Campbell, CA (US); Aviv Shoval, Palo Alto, CA (US)

(73) Assignee: AMAZON TECHNOLOGIES, INC., Reno, NV (US)

( * ) Notice: Subject to any disclaimer, the term of this patent is extended or adjusted under 35 U.S.C. 154(b) by 259 days.

(21) Appl. No.: 14/306,030

(22) Filed: Jun. 16, 2014

(51) Int. Cl.
*B29C 65/14* (2006.01)
*H05K 3/36* (2006.01)
*H05K 1/14* (2006.01)
*G06F 3/041* (2006.01)

(52) U.S. Cl.
CPC .............. *H05K 3/36* (2013.01); *G06F 3/041* (2013.01); *H05K 1/144* (2013.01)

(58) Field of Classification Search
CPC .......... H05K 3/36; H05K 1/144; G06F 3/041; B29C 65/14
See application file for complete search history.

(56) References Cited

U.S. PATENT DOCUMENTS

| 2003/0145940 | A1* | 8/2003 | Chaudhury | ................ C09J 5/02 156/272.6 |
| 2009/0183819 | A1* | 7/2009 | Matsuhira | ............... B32B 37/12 156/99 |
| 2011/0177261 | A1* | 7/2011 | Ishii | .................. G02F 1/133308 428/1.5 |
| 2013/0139962 | A1* | 6/2013 | Hill | ........................ G02B 27/62 156/275.5 |

* cited by examiner

Primary Examiner — Daniel McNally
(74) Attorney, Agent, or Firm — Polsinelli LLP

(57) ABSTRACT

Utilizing a pressure-sensitive adhesive (PSA) for assembling an electronic device can have certain benefits, such as ease of automation and instant handling or short handling time that may save time, effort, and costs during manufacturing. A liquid adhesive, on the other hand, can provide superior bond strength relative to a PSA such that a device manufactured using a liquid adhesive may perform better with respect to structural rigidity, dynamic response, impact resistance, and other reliability testing. An electronic device manufacturer can take advantage of the benefits of each type of adhesive during device assembly by incorporating both a PSA and a liquid adhesive to bond two substrates of the device, such as a cover glass or sheet and a housing structure or frame.

20 Claims, 9 Drawing Sheets

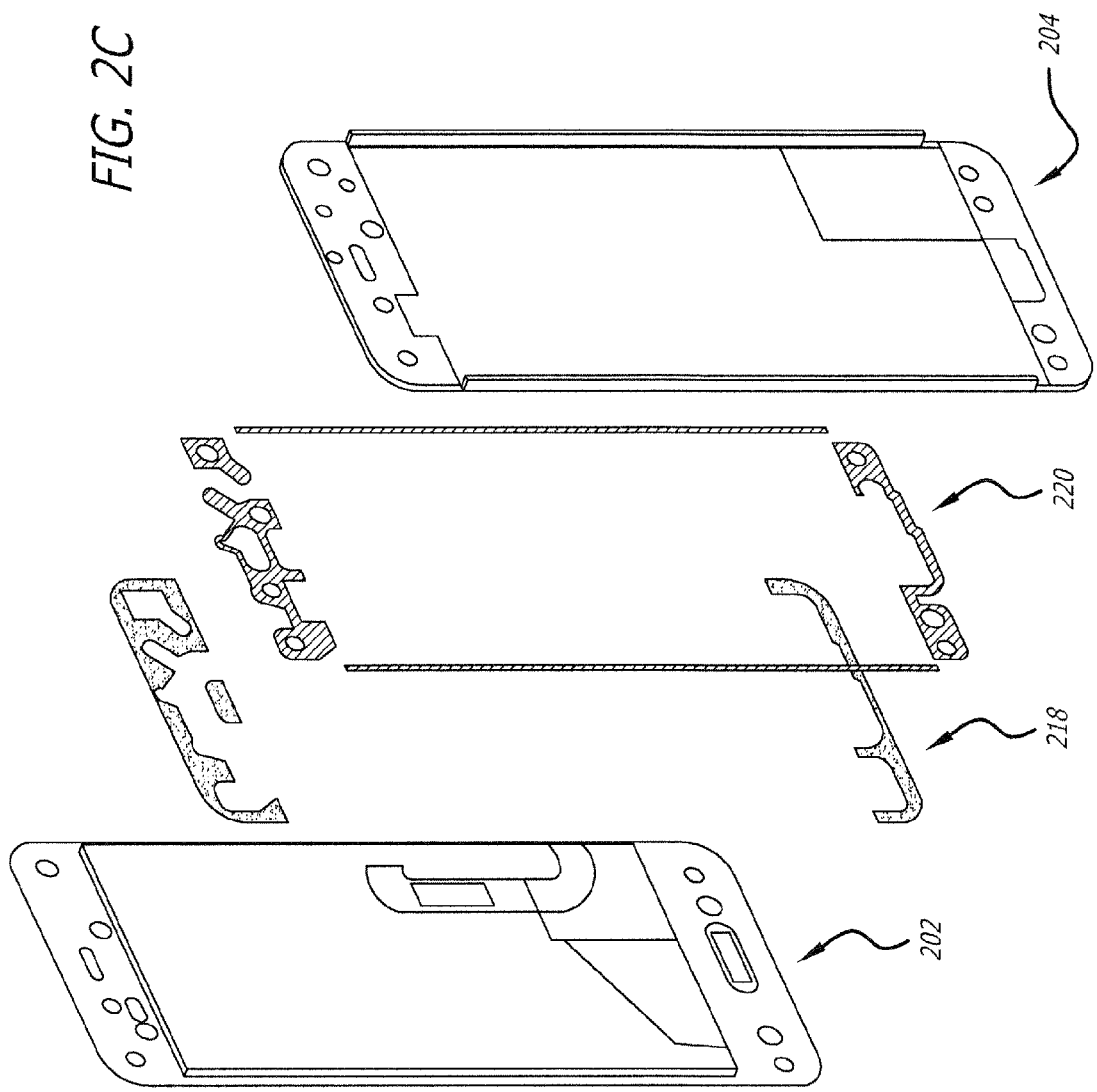

HYBRID BONDING TECHNIQUES FOR ELECTRONIC DEVICES

BACKGROUND

People are increasingly utilizing portable electronic devices, such as smart phones, tablet computers, wearable computing devices (e.g., smart watches), among others, for a variety of tasks. Many of these devices have at least one display/touch assembly that can include a display element (e.g., liquid crystal display (LCD), organic light-emitting diode (OLED), electronic ink (e-ink), etc.), a touch element (e.g., resistive, capacitive, surface acoustic wave, or infrared touchscreen, etc.), and an overlying transparent layer. This overlying layer, referred to as a "cover sheet," "cover glass," or "cover lens" is attached to the display/touch assembly by a process sometimes referred to as "optical bonding." Optical bonding involves utilizing a clear adhesive to join one or more substrates of a display and/or touch element. Optical bonding can serve several different important functions for electronic devices. Optical bonding can significantly improve optical performance of the display element. For example, optical bonding can minimize the air gap between the cover sheet and display element and thus reduce the number of reflective surfaces of the electronic device's display element. Optical bonding may also reduce the light loss due to reflection. This can improve the viewing experience of the user while using less power consumption and thereby extending the battery life of the device. In addition, optical bonding can reduce parallax error and can produce a thinner product by eliminating or minimizing the air gap between the cover sheet and the display element.

After a cover sheet is optically bonded to a display and/or touch element, the cover sheet of the display/touch assembly (i.e., display element, touch element, and bonded cover sheet) can be utilized as a mounting surface for attaching the display/touch assembly to other components of the electronic device, such as cameras, ambient light detectors, infrared sensors, antennas, or housings or frames for printed circuit boards (PCBs), among other components. Typically these other components are bonded to the cover glass to help seal the components from moisture, dust, light, sound, etc. Optical bonding and bonding of the cover sheet to other device components thus provide a variety of benefits for electronic devices but certain conventional bonding techniques require extensive time and effort during the manufacturing process. This can delay assembly of the devices and increase the costs of production. Other conventional bonding processes may not require as much time and effort but assembled devices from such conventional processes may be more susceptible to damage from lens crack or delamination.

BRIEF DESCRIPTION OF THE DRAWINGS

Various embodiments in accordance with the present disclosure will be described with reference to the drawings, in which:

FIGS. 2A, 2B, and 2C illustrates an example of hybrid bonding of substrates of an electronic device that can be used in accordance with an embodiment;

DETAILED DESCRIPTION

Figure 1:
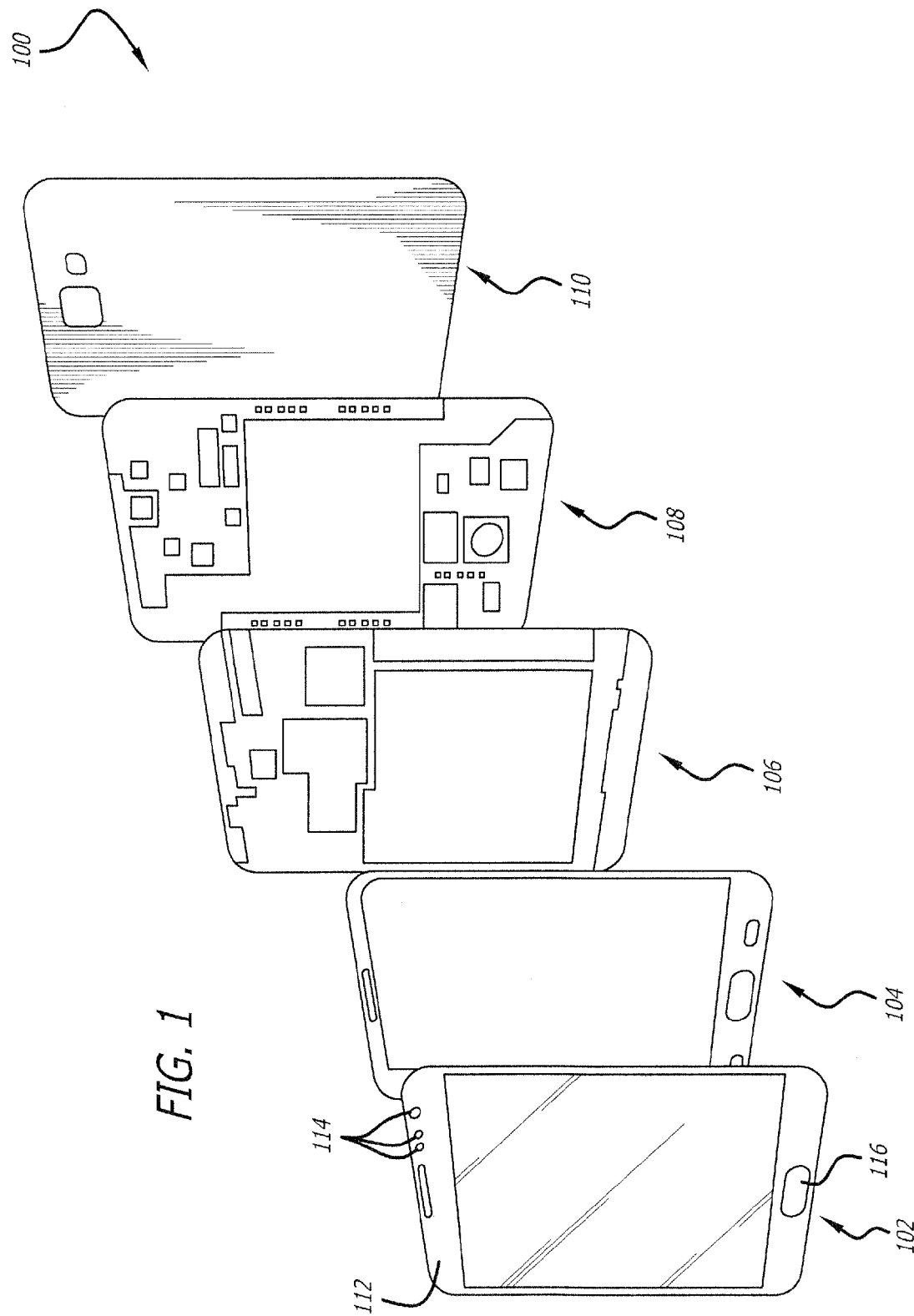
FIG. 1 illustrates an example of components of an electronic device that can be utilized in accordance with various embodiments.

Systems and methods in accordance with various embodiments of the present disclosure may overcome one or more of the aforementioned and other deficiencies experienced with bonding of substrates of electronic devices. In particular, various embodiments enable a display and/or touch assembly, comprising a display element (e.g., liquid crystal display (LCD), organic light-emitting diode (OLED), electronic ink (e-ink), etc.) and/or touch element (e.g., resistive, capacitive, surface acoustic wave, or infrared touchscreen, etc.), and cover sheet, to be assembled more quickly than conventional approaches yet provide for assemblies that are as durable or substantially as durable as those produced using conventional techniques. A display element generally comprises the various substrates of a display screen excluding the cover sheet. For example, an LCD display element includes the backlight, the polarizing layers, and the substrates sandwiched between the polarizers (e.g., color filter, thin-film transistor (TFT) layers, liquid crystal layer, etc.), and an OLED display element includes the anode layer and cathode layer and the substrates in between (e.g., emissive layer, conductive layer, etc.). A touch element generally comprises the various substrates of a touchscreen excluding the cover glass. For example, a resistive touch element includes the flexible top film and the ITO conductive layers, and a capacitive touch element includes the conductive top substrate and the ITO conductive layers. In various embodiments, bonding of a cover sheet of a display and/or touch assembly to other components of an electronic device can be accomplished using less time and effort than conventional methods yet create a bond between the cover sheet and other device components that is as strong or substantially as strong as conventional processes. The other components can include cameras, ambient light detectors, infrared sensors, antennas, batteries, or housings or frames for printed circuit boards (PCBs), among others.

In various embodiments, bonding of a display element, touch element, and/or cover sheet or bonding of the cover sheet to other components of an electronic device can be achieved using hybrid bonding techniques. An adhesive requiring little to no "handling time," such as a pressure-sensitive adhesive (PSA), can be applied to first portions of a first substrate of an electronic device (e.g., cover glass, polarizer, ITO layer), and an adhesive requiring a greater "handling time," such as a liquid adhesive, can be applied to second portions of the first substrate. A second substrate can then be attached to the first substrate. As used herein, "handling time" refers to a length of time after which an adhesive has been applied and the substrates have been joined such that the joint or assembly is strong enough to hold itself in position and the substrates can no longer move independently, such as when the applied adhesive is at least at 50-60% of full bond strength or full bond cure in some embodiments. Due to its instant or short handling time (e.g., permitting handling after applying minimal pressure between bonding surfaces), the PSA can secure the first substrate and the second substrate in place to enable other manufacture or processing steps to be performed on the bonded substrates without the delay that would otherwise be necessitated for waiting for the liquid adhesive to cure. However, once production of the electronic device is completed and by which time the liquid adhesive will have fully cured, the device benefits from the relatively superior bond strength provided by the liquid adhesive. Thus, hybrid bonding techniques can be utilized to reduce the time, effort, and costs to produce assemblies or devices relative to conventional processes using only liquid adhesives but the devices or assemblies manufactured using hybrid bonding techniques are more durable or comparatively durable to conventional processes using either liquid adhesives or PSAs alone. That is, assemblies or devices utilizing hybrid bonding techniques can withstand impact, vibration, extreme temperatures and humidity, and similar adverse conditions better than or comparable to assemblies or devices utilizing conventional approaches as determined by structural rigidity, dynamic response, impact resistance, and other reliability testing.

Various other functions and advantages are described and suggested below in accordance with the various embodiments.

FIG. 1 illustrates an example of components of an electronic device 100 that can be used in accordance with various embodiments. Although a portable electronic device (e.g., a smart phone, tablet, e-book reader, or portable media player) is shown that can be held in the user's hands, it should be understood that other types of electronic devices can utilize aspects of the various embodiments as should be apparent in light of the teachings and suggestions contained herein, including all-in-one desktop computers, laptop computers, computer monitors, televisions, electronic kiosks, wearable computing devices, among other types of electronic devices. In this example, the electronic device includes a cover sheet 102, a display/touch element 104, a front housing structure 106, a main PCB 108, and a back housing structure 110. It should be understood that, while the components of the example device are described to be on a "front" of the device, there can be similar or alternative components on the "top," "side," or "back" of the device as well (or instead). Further, directions such as "top," "front," "side," and "back" are used for purposes of explanation and are not intended to require specific orientations unless otherwise stated.

The cover sheet 102 comprises a single sheet of glass, and can be made of any appropriate type and material, such as soda lime glass, Gorilla glass, float glass, or manufactured sapphire. In other embodiments, the cover sheet may be made out of polymethyl methacrylate (PMMA) or other clear plastic. The cover sheet 102 is an edge-to-edge cover sheet that extends to the edges of the electronic device, and wraps around the corners of the device. The ability to include edge regions with the cover sheet can increase the surface area of the cover sheet, which can enable enhancement of the durability of the cover sheet from a process such as chemical strengthening. Further, the edge portions can be thicker than the primary display portion, which can provide further strength and ruggedness. In addition, the edge-to-edge cover sheet can enable an entire face of a device and edges to potentially be display-capable and/or touch-sensitive, among other advantages. The cover sheet 102 also includes one or more through holes or blind holes 116 that have been drilled or otherwise formed for mechanical buttons or for enabling passage of audio, light, infrared (IR) light, etc. In other embodiments, a cover sheet can be bonded to a frame made of a material such as metal, polycarbonate (PC), polyethylene terephthalate (PET), polybutylene terephthalate (PBT), or other suitable material.

In this example, the back surface of the cover sheet 102 is coated with an ink mask 112 around the perimeter of the sheet with certain portions 114 uncoated to expose components such as cameras, ambient light sensors, infrared detectors, biometric scanners (e.g., fingerprint reader, retinal scanner, etc.), among others. The ink 112 prevents backlight from leaking around the edges of the display element. If unmasked, light leakage around the edges of the active area of the display element can create an undesirable halo effect or other visual defects. The ink 112 also masks the inner components of the device and the adhesive used to bond the cover sheet to other components of the device, such as a housing structure for a PCB. The ink can be made of any appropriate type and material. In at least some embodiments, an ink having a high surface energy is selected for facilitating bonding between the cover sheet and the other components of the electronic device. In some embodiments, the cover sheet may also be treated with an anti-reflective, anti-smudge, and/or anti-glare coating. In some embodiments, the cover sheet may incorporate ITO heaters for extending the temperature range of the display element and/or electromagnetic interference (EMI) filters.

The cover sheet 102 is bonded to the display/touch element 104 using a liquid optically clear adhesive (LOCA) or optically clear adhesive (OCA) tape. The LOCA or OCA tape can be made of any appropriate type and material, such as acrylic or silicone, from a provider such as Henkel®, 3M®, or Tesa®. When both the cover sheet and the top substrate of the display/touch element are made of glass, a fast curing, high-strength, refractive index matched LOCA or OCA tape can be utilized for bonding the cover sheet and display/touch element. When bonding a plastic cover sheet to a glass substrate or a glass cover sheet to a plastic substrate, the plastic can be more difficult to adhere to than glass and the plastic has different coefficients of thermal expansion than glass, and, thus, a very high strength LOCA or OCA tape may be required. In at least some embodiments, the cover sheet can be bonded to the display/touch element using hybrid bonding techniques as discussed elsewhere herein.

In this example, the display/touch element 104 comprises an LCD and a projected capacitance touchscreen. In other embodiments, a display/touch element can utilize OLED, e-ink, or other display technology for display and/or resistive, surface acoustic wave, infrared touchscreen, or other touch technology for touch capabilities. The display/touch element can comprise a separate display element and touch element that have been bonded together, or the display/touch can comprise a composite element in an "in-cell" or "on-cell" configuration as discussed elsewhere herein. The display/touch assembly, including the cover sheet 102 bonded to display/touch element 104, is attached to housing structure 106.

As discussed, there are various conventional approaches for mounting a display/touch assembly (including display element, touch element, and bonded cover sheet) to a housing structure or other component of an electronic device. One conventional approach is to bond the cover sheet to a housing or support structure or frame using only a PSA. This particular approach may necessitate a treatment of the bonding surfaces to increase the surface energy of the bonding surfaces, such as by plasma cleaning. However, when the cover sheet is attached to a display and/or touch element, plasma cleaning and other treatments of the cover sheet can have harmful effects on various layers of the display and/or touch element, such as the ITO layers. Further, using a PSA alone to bond a cover sheet to a housing structure may not yield sufficient bond strength such that the assembly or device may be more prone to lens crack or delamination than an assembly or device bonded using an adhesive requiring a longer handling time, such as a liquid adhesive. Another conventional approach for attaching a cover sheet to a housing structure of an electronic device is via a liquid adhesive alone. Substrates bonded using a liquid adhesive exhibit greater durability than substrates bonded using a PSA—as much as three times the bond strength for state-of-the-art adhesives. However, liquid adhesives have lengthy handling times, such as several hours or more, and the production line is interrupted until the liquid adhesive has cured to a sufficient strength for handling (e.g., at least 50-60% of full bond strength in some embodiments). Further, the use of liquid adhesives alone may require greater precision and process control that may not be suitable for a mass production environment. In addition, the use of liquid adhesives alone requires additional equipment, such as clamps for holding the bonded substrates in place while the liquid adhesive cures to a sufficient degree that the bonded substrates can be handled.

Systems and approaches in accordance with various embodiments utilize hybrid bonding techniques for assembling an electronic device. A PSA can be applied to portions of the housing structure to which the cover sheet will be bonded to hold the cover sheet in place (or the PSA can be applied to the cover sheet for bonding to the housing structure in some embodiments). Using a PSA for assembling an electronic device can offer various advantages. Application of a PSA during manufacturing or assembly can be easily automated and typically does not require elaborate or specialized equipment. When utilized in manufacturing or assembly, incorporating a PSA can substantially save time and effort as compared to other types of adhesives (e.g., liquid adhesives) because application of a PSA may not require setup or long handling times. Further, most PSAs enable immediate handling after applying a minimum amount of pressure between two joined substrates. Some PSAs have handling times from 2 to 90 minutes. Thus, using a PSA can enable manufacturing processes to continue uninterrupted or minimal interruption. An additional benefit of using a PSA in conjunction with a liquid adhesive is the minimization or elimination of the use of "ribs" for guaranteeing bond thickness. In conventional approaches that use a liquid adhesive alone to join two substrates, ribs are incorporated in the adhesive layer to ensure uniform thickness or z-height between bonded substrates. Further, these ribs can also function as "dams" to prevent the liquid adhesive from flowing out of the display/touch assembly or into the backlight of an LCD element. By using the hybrid bonding techniques disclosed herein, such ribs or dams are unnecessary and thereby further simplify the manufacturing process. As will be appreciated, this can result in significant time and labor savings for electronic device manufacturers.

A PSA can also provide an insulating seal, as well as sound and vibration control. Thus, a PSA can be disposed around those regions corresponding to where cameras, infrared sensors and emitters, audio elements (e.g., microphones, speakers), and similar components are positioned on the face of the device. A liquid adhesive can be applied to the remaining portions of the housing structure to which the cover sheet will be bonded. Application of the liquid adhesive need not be as precise as in conventional approaches due to the presence of the PSA. Further, clamps and other specialized equipment are not required as in conventional approaches. In this manner, production of the electronic device can proceed without the delay associated with the long handling or cure time of a liquid adhesive or the additional processing and equipment required by conventional methods. Thus, the hybrid bonding techniques disclosed herein take advantage of the various benefits of utilizing a PSA for bonding a cover sheet to a housing structure while the finished assembly or device is bonded according to or substantially according to the full bond strength of the liquid adhesive.

Figure 2A:
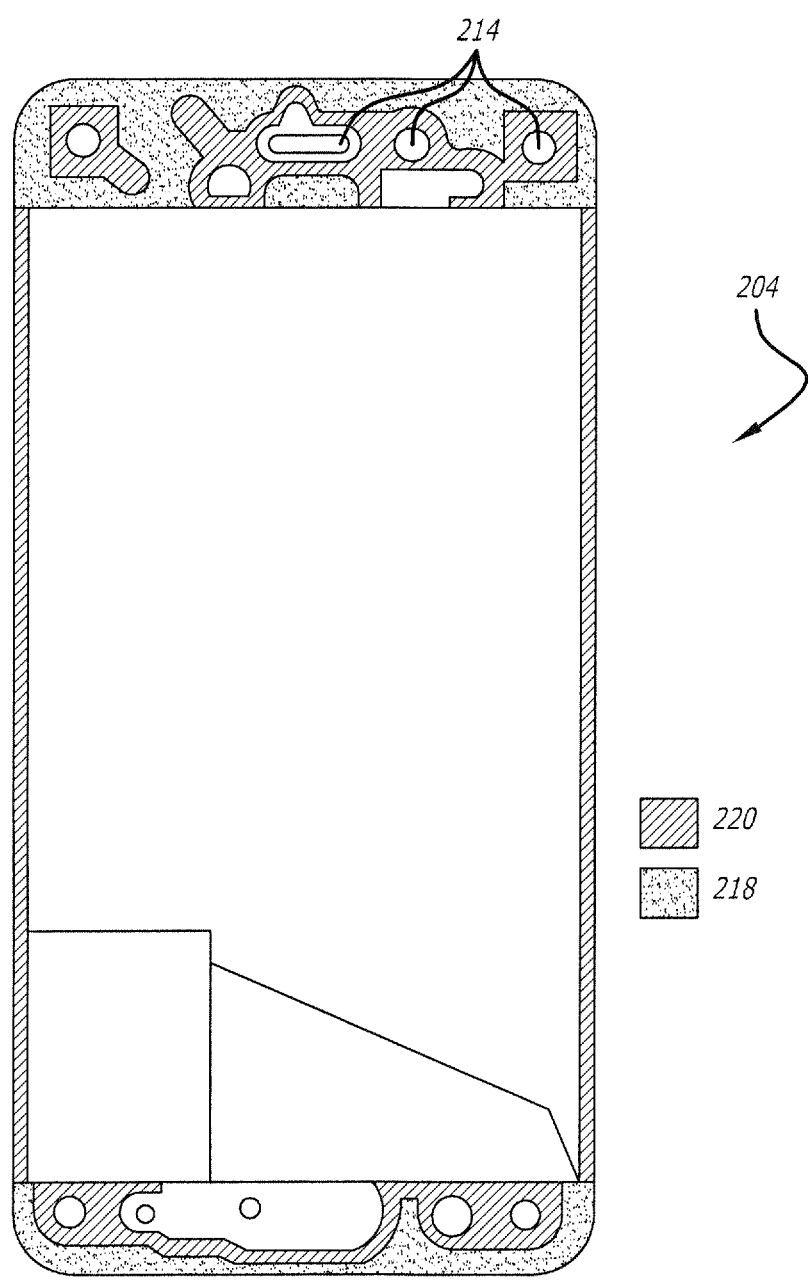
Figure 2B:
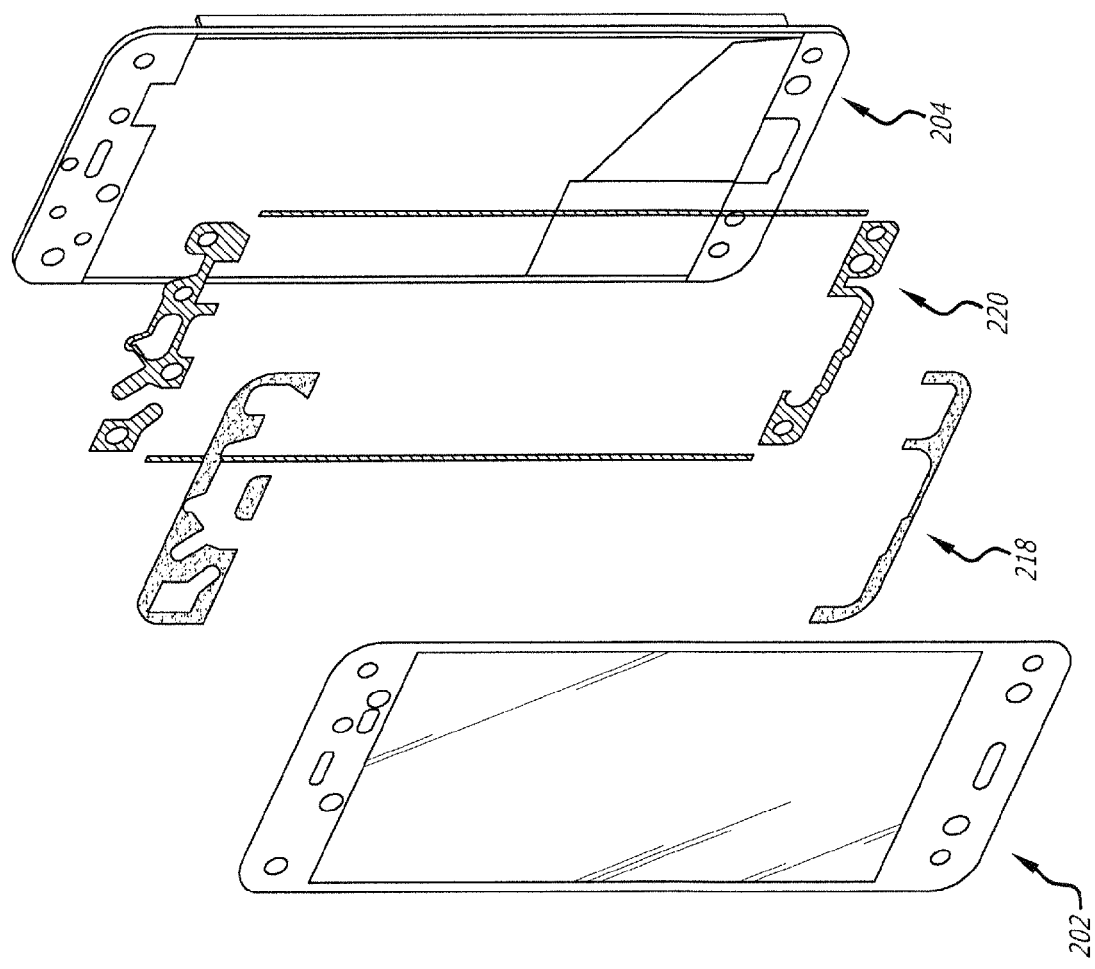

FIGS. 2A, 2B, and 2C illustrate an example of a bonding pattern for joining two substrates of an electronic device using hybrid bonding techniques in accordance with an embodiment. FIG. 2A illustrates a front face view of a housing structure 204 with a liquid substrate bonding pattern 218 and a PSA bonding pattern 220. In this example, the PSA 220 can be seen disposed on the front surface of the housing structure around regions 214 corresponding to where components such as cameras, IR transceivers, light-emitting diodes (LEDs), light sensors, and the like, would be positioned on the face of the device. As discussed, the PSA can function as an insulating seal that can be advantageous for blocking light that may interfere with the functionality of the cameras, LEDs, light sensors, IR components, etc. A PSA can also provide sound and vibration control, and thus, the PSA can also be disposed around regions for through-holes or blind holes for buttons, microphones, speakers, biometric scanners, and similar components. As can also be seen in the pattern of the PSA 220, the PSA is arranged throughout the front of the housing structure 204 so as to provide a "skeleton" or "ribs" for the adhesive layer. Such a configuration ensures that the adhesive layer, i.e., PSA and liquid adhesive, will comprise a determined thickness or height as specified by manufacturing processes. In various embodiments, the PSA can also serve as "dams" to prevent liquid adhesive from flowing out of the display/touch assembly and/or into the backlight of an LCD.

FIG. 2B illustrates a cross-sectional view of the cover sheet 202, liquid substrate bonding pattern 220, PSA bonding pattern 218, and housing structure 204 from front to back, and FIG. 2C illustrates a cross-sectional view of the cover sheet, liquid substrate bonding pattern, PSA bonding pattern, and housing structure from back to front. The housing structure 204 is made of PC, PET, or PBT, although other materials can also be used for the housing structure, such as other types of plastic, metal, glass, etc. The cover sheet 202 is made of glass, such as soda lime glass, Gorilla glass, or float glass. In other embodiments, the cover sheet may be made out of other types of glass, plastic, manufactured sapphire, among other suitable materials. Although the examples of FIGS. 2A-2C illustrate bonding of a plastic substrate to a glass substrate, it should be understood that other combinations can be used in various embodiments, such as glass (e.g. cover glass) to metal (e.g., housing), glass (e.g., cover glass) to glass (e.g., housing or display/touch component), plastic (e.g., housing) to metal (e.g., housing), plastic (e.g., cover sheet or housing) to plastic (e.g., housing), among other combinations.

In this example of FIGS. 2B and 2C, the cover sheet 202 and housing structure 204 can be seen to be relatively co-planar with respect to each other. In various embodiments, the degree of flatness of the surfaces of substrates that can be joined using the hybrid bonding techniques disclosed herein ranges from 0-0.4 flatness. The cover sheet and housing structure are bonded by applying a light pressure. In an embodiment, a minimum pressure of 15-30 psi can be used to join the cover sheet to the front housing structure. As understood by those of ordinary skill in the art, the maximum amount of pressure that can be used to join substrates depends on the characteristics of the substrates, the PSA, and the liquid glue to prevent damage to the assembly. In this example, the PSA holds the cover sheet and housing structure in place such that other processing steps can be performed on the front assembly, such as mounting a PCB, cameras, light sensors, IR detectors and emitters, and other components, interconnecting the display and touch elements to the PCB, among other possibilities.

Figure 3:
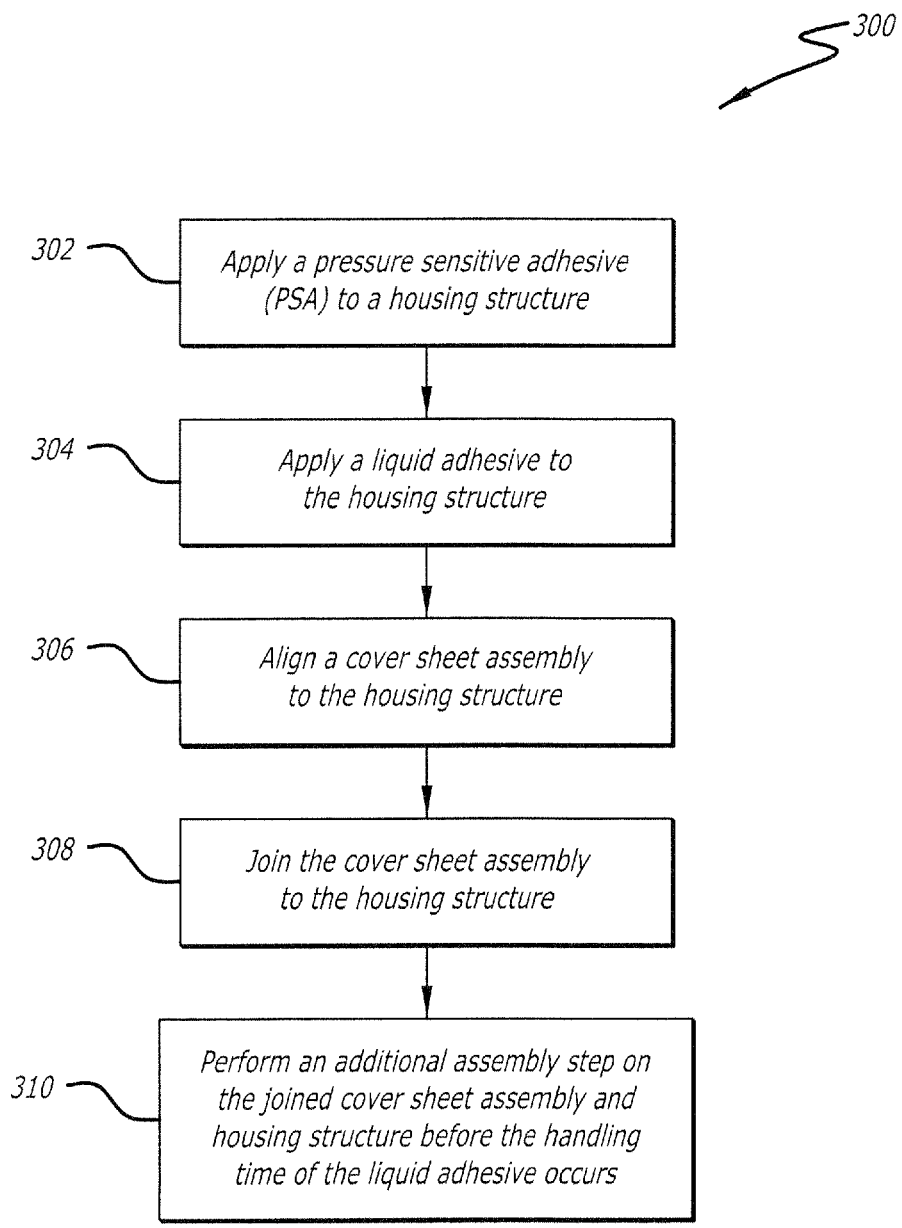
FIG. 3 illustrates an example process for hybrid bonding of substrates of an electronic device that can be used in accordance with an embodiment.

FIG. 3 illustrates an example of a process 300 for assembling an electronic device using hybrid bonding techniques in accordance with an embodiment. It should be understood, however, that there can be additional, fewer, or alternative steps performed in similar or alternative orders, or in parallel, within the scope of the various embodiments unless otherwise stated. In this example, the process may begin by applying an adhesive with an instant handling time or short handling time, such as a PSA, to first portions of a first bonding substrate 302, such as a cover sheet or a housing structure. In an embodiment, a double-sided PSA tape is die cut to encompass those regions corresponding to where cameras, infrared sensors and emitters, audio elements (e.g., microphones, speakers), and similar components are positioned on the face of the device and applied to the first substrate using automated high-precision machinery.

After the PSA is applied to the first bonding substrate (e.g., cover glass, housing), a liquid adhesive is applied to the remaining portions where the first substrate will be bonded to a second substrate of the electronic device 304 (e.g., housing structure, cover sheet). In an embodiment, a liquid adhesive is applied to the first substrate by an automated adhesive dispenser via liquid adhesive beads. In some embodiments, the process may also require an active curing step depending on the type of PSA and liquid adhesive used. Some adhesives are water-based or solvent-based, and curing of such adhesives involves drying or evaporating the water or solvent, respectively. Some adhesives are cured by a chemical reaction, such as via exposure to ambient humidity, ultraviolet (UV) radiation, ambient air or oxygen, or to the exclusion of air or oxygen (e.g., placing the assembly in an oxygen-free environment and catalyzing curing by metallic ions). In other embodiments, curing involves letting the joined substrates set for a determined period of time. For example, some adhesives are comprised of multiple components that react when mixed and harden over a period of time after application. As another example, some adhesives are hot-melt, and are applied in molten form and harden as they cool to room temperature.

In this example, the process can continue by aligning the second substrate to the first substrate 306 and joining the second substrate to the first substrate with a light amount of pressure 308 using automated high-precision machinery. As discussed, a minimum amount of pressure of 15-30 psi can be used to join the two substrates. A maximum amount of pressure depends on the characteristics of the substrates, the liquid adhesive, and the PSA. The PSA holds the front housing assembly (i.e., bonded cover sheet, touch element, display element, and front housing structure) in place and additional manufacture processing steps can be performed on the front housing assembly 310, such as mounting a PCB, cameras, light sensors, IR detectors and emitters, and other components, interconnecting the display and touch elements to the PCB, mounting the front housing assembly to a back housing assembly, among other possibilities. The PSA enables instant or virtually instant handling of the bonded substrates despite the liquid adhesive corresponding to a lengthier handling time. Thus, additional assembly steps can be performed on the cover sheet assembly and/or housing structure before the handling time of the liquid adhesive occurs. However, once assembly is complete, the electronic device obtains the benefits of the superior bond strength of the liquid adhesive.

Figure 4A:
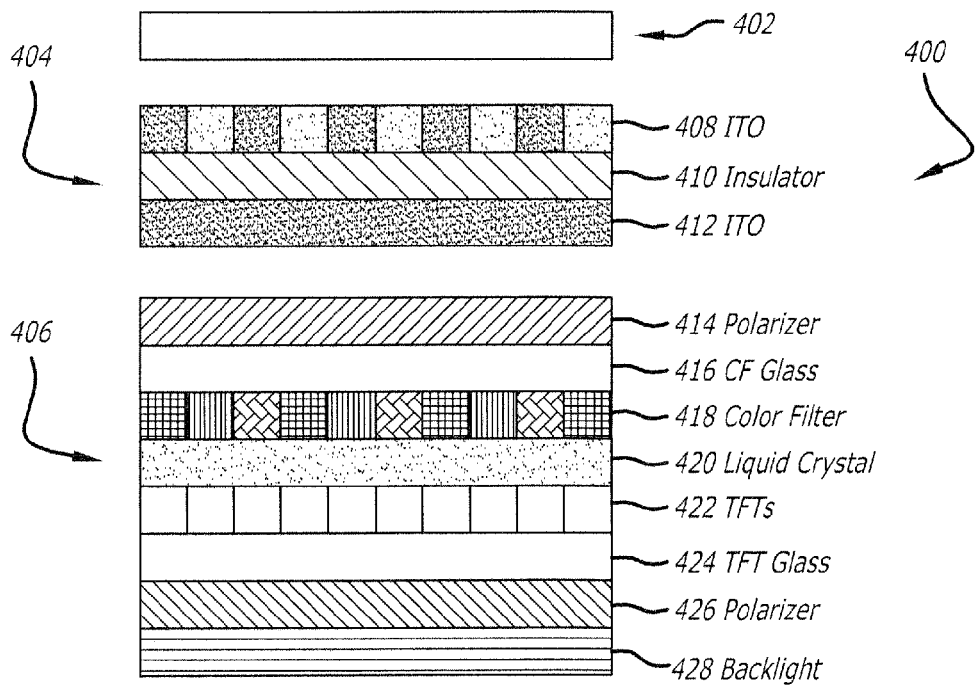
FIGS. 4A-4C illustrate example configurations for a display and touch element that can be used in accordance with various embodiments.
Figure 4B:
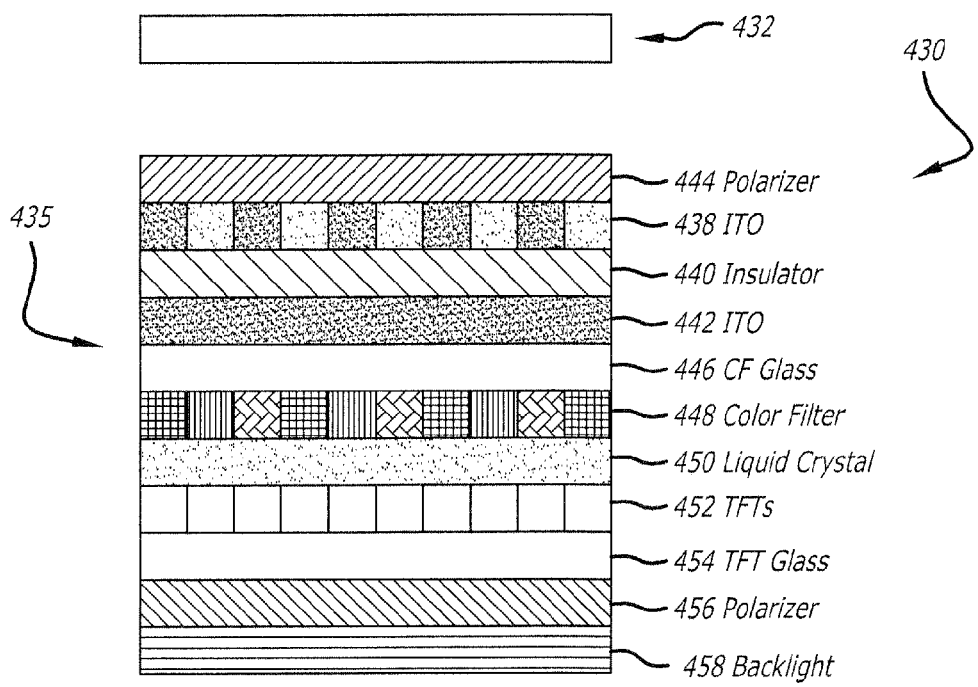
Figure 4C:
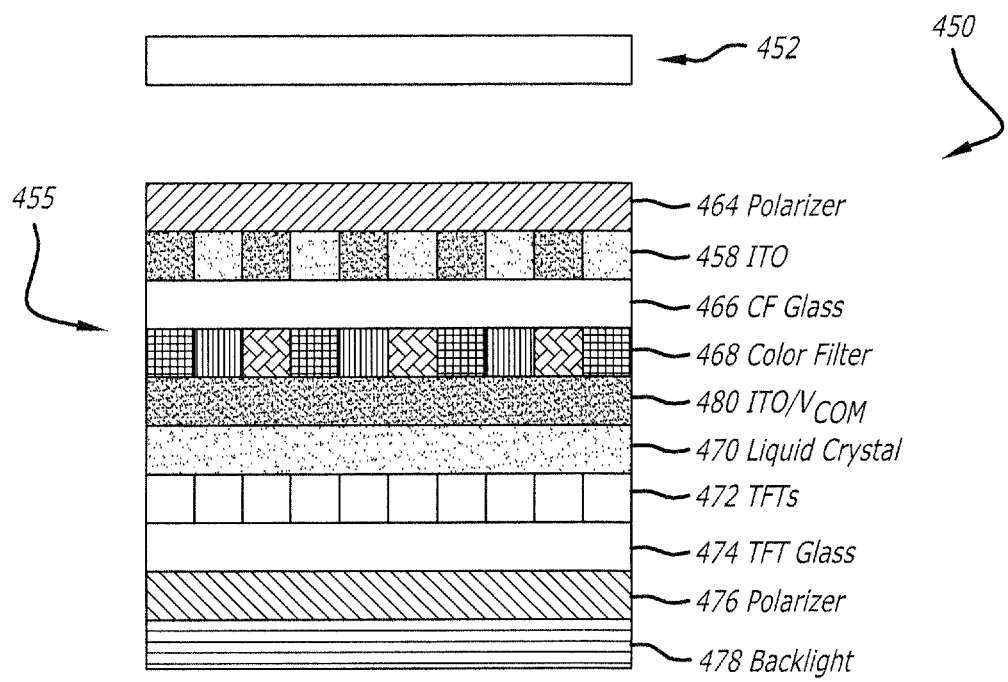

FIG. 4A-4C illustrate examples of display and touch elements that can be used in accordance with various embodiments. Shown in FIG. 4A is an example 400 of a cross section of a touch element 404 and display element 406. In this example, display element 406 is an LCD display and touch element 404 is based on projected capacitance. As mentioned, in other embodiments, other display technologies (e.g., OLED, e-ink, etc.) and/or other touch technologies (e.g. resistive, surface acoustic wave, infrared, etc.) may be used. The touch element 404 may include two layers 408 and 412 of metal lines or conductors that are separated by an insulator 410, such as glass, PET, PMMA, or other transparent insulating material. The conductors may be made of transparent ITO and are positioned perpendicular or substantially perpendicular (e.g., rows and columns) to one another so that a device can sense an X position and a Y position when touched. Also disposed on the top ITO layer 408 is a plurality of touch sensors (e.g., capacitors) each located at where the rows and columns of the conductors cross over each other while being separated by the insulating material. Other circuitry elements of the touch sensor, such as TFTs, other capacitors, among others, may also be disposed on one of and/or between the two ITO layers 408 and 412.

The layers 410, 412, and 414 of the touch element 404 are bonded together using a LOCA or OCA tape. In at least some embodiments, various layers of the touch element can be bonded using hybrid bonding techniques. For example, a thin OCA tape can be used to bond at least portions of the various layers of the touch element to enable instant handling or handling within a short period of time while a LOCA interspersed between the OCA tape can provide a stronger bond upon assembly of the touch element and full cure of the LOCA. In this manner, the layers of the touch element can be bonded together and additional assembly steps can occur (e.g., bonding to a display element, cover sheet, and/or housing) instantly or within a short period of time as the OCA tape holds the layers of the touch element in place. After assembly of the touch element has been completed and the LOCA has fully cured, the touch element can take advantage of the superior bond strength provided by the LOCA.

The display element 404 comprises a plurality of layers, including at least a top glass 416, liquid crystal 420, and bottom glass 424. The top and/or bottom glass can also be patterned with various layers of conducting materials, TFTs 422, and other circuit elements that allow the voltage across the liquid crystal to be varied to manipulate the orientation of the liquid crystal and control the brightness of the pixel. In particular, the TFT layer 422 may include a plurality of scan lines that are arranged perpendicular or substantially perpendicular to a plurality of signal lines which connect to TFTs and pixel electrodes proximate to where the lines cross over one another. The display element also includes polarizer layers 414 and 426 for filtering light matching the orientation of the respective polarizers, a color filter layer 418 for providing the display of color, and backlighting 428.

The layers 414, 416, 418, 420, 422, 424, and 426 of the display element 406 are bonded together using a LOCA or OCA tape. In at least some embodiments, various layers of the display element can be bonded using hybrid bonding techniques. For instance, an OCA tape or other adhesive with an instant or short handling time, can be used to bond at least portions of the various layers of the display element to enable instant handling or handling within a short period of time. A LOCA, or an adhesive with a lengthier handling time but capable of providing a stronger bond than the OCA tape, can be disposed between the OCA tape such that the display element can take advantage of the stronger bond provided by the LOCA upon completion of assembly of the display element and full cure of the LOCA. The OCA tape can hold the layers of the display element in place instantly or within a short period of time to enable other assembly steps to occur (e.g., bonding additional layers of the display element or bonding to a touch element, cover sheet, and/or housing). After the display element has been assembled and the LOCA has fully cured, the display element benefits from the bond strength provided by the LOCA.

In this example, the cover sheet 402, touch element 404, and display element 406 are separate and discrete components. The cover sheet, touch element, and display element may be manufactured by separate vendors, and can be integrated by laminating the touch element 404 to the top polarizer layer 414 of the display element 406 and bonding the cover sheet 402 to the display and touch element using a LOCA or OCA tape. In at least some embodiments, the cover sheet can be bonded to a display/touch element using hybrid bonding techniques as discussed elsewhere herein. For example, an adhesive with an instant or short handling time (e.g., OCA tape) can be used to bond at least portions of the cover sheet to a display and/or touch element to enable instant handling or handling within a short period of time. A stronger bonding adhesive with a lengthier handling time (e.g., a LOCA) can be disposed between the OCA tape such that the cover sheet assembly (i.e., cover sheet and display element and/or touch element) can benefit from the stronger bond provided by the LOCA upon completion of assembly of the cover sheet assembly and full cure of the LOCA. The OCA tape can hold the cover sheet and display and/or touch elements in place instantly or within a short period of time to enable other assembly steps to occur (e.g., bonding the cover sheet assembly to a housing structure). After the cover sheet assembly has been assembled and the LOCA has fully cured, the cover sheet assembly is bonded together according to or substantially according to the stronger bond of the LOCA.

In other embodiments, the touch element can be integrated with a cover sheet or display element. For example, the top ITO layer 408 of the touch component 404 can be bonded the back of the cover sheet 402 and patterned to form the first layer of conductors (e.g., rows or columns). A thin insulator can be added to the bottom of the top ITO layer/cover sheet, and the bottom ITO layer can be deposited to the insulator and patterned to form the second layer of conductors (e.g., columns or rows). The touch element integrated with the cover sheet can be laminated onto a display element. Such a configuration is sometimes referred to as "on-stack" or "sensor on lens."

In still other embodiments, the display component and the touch component can be integrated according to "on-cell" or "in-cell" configurations. A "cell" is the area between a top color filter glass and bottom TFT array glass of each pixel of a touch element. A touch element can be referred to as "on-cell" when layers of the touch element are incorporated within the display element but the ITO layers of the touch element are located above the color filter glass substrate. FIG. 4B illustrates an example 430 of a cross section of an on-cell configuration of a display/touch element 435 that can be used in accordance with an embodiment. A conductive layer of ITO 442 can be deposited directly on the top layer of glass 446 of the display element and then patterned to form the conductors, TFTs, and/or other elements of the circuitry for the touch component. A thin insulating layer 440 can be applied, and a second ITO layer 438 can be deposited and patterned with the second layer of conductors, TFTs, and/or other circuitry elements. A top polarizing layer 444 can be applied on top, and the cover sheet 432 can be optically bonded to the display and touch element 435. As shown here, elements of the touch element, such as ITO layer 438, insulator 442, and ITO layer 442 are located within layers of the display element, i.e., between the top polarizer 444 and the top glass 446 of the display element. However, the ITO layers 438 and 442 of the touch element are located above the cell. That is, the ITO layers of the touch element are above the top glass 446 and bottom glass 454 of the display element.

A touch element can be referred to as "in-cell" when at least one of the ITO layers of the touch element is stacked between the top glass and the bottom glass of the display element. This can reduce the number of discrete layers, and may result in a thinner and less expensive display and touch element. FIG. 4C illustrates an example 450 of a cross section of an in-cell configuration of a display and touch element 455 that can be used in accordance with an embodiment. The top ITO layer 458 of the touch element can be bonded to the top glass layer 466 of the display element, which can operate as the insulator between the two ITO layers of the touch element. Further, an ITO layer can be shared between the touch element and display element. For example, a single ITO layer 480 can be used to implement both $V_{COM}$ and a portion of the conductors for the touch element. $V_{COM}$ is a reference voltage for TFT LCDs. A display driver interface integrated circuit will drive the red, green, or blue (RGB) video amplitude for a pixel to a source of the pixel TFT when its gate is open, and a storage capacitor is formed between the TFT's drain and the $V_{COM}$ reference potential. The stored voltage creates an electric field across the liquid crystal material that will then act as a valve to pass the brightness level from the LCD backlight. In certain LCDs, the $V_{COM}$ layer may comprise a non-patterned ITO layer that extends across the whole active area of the LCD module. In this configuration, however, the $V_{COM}$ layer is patterned to form the conductors for one of the rows or columns of the touch matrix so that this ITO layer can be used by both the touch element and the display element. In in-cell and on-cell configurations, the various layers of the display and touch element can be respectively bonded using a LOCA or OCA tape. In at least some embodiments, the various layers of the display and touch element can be bonded using hybrid bonding techniques as discussed elsewhere herein.

Figure 5:
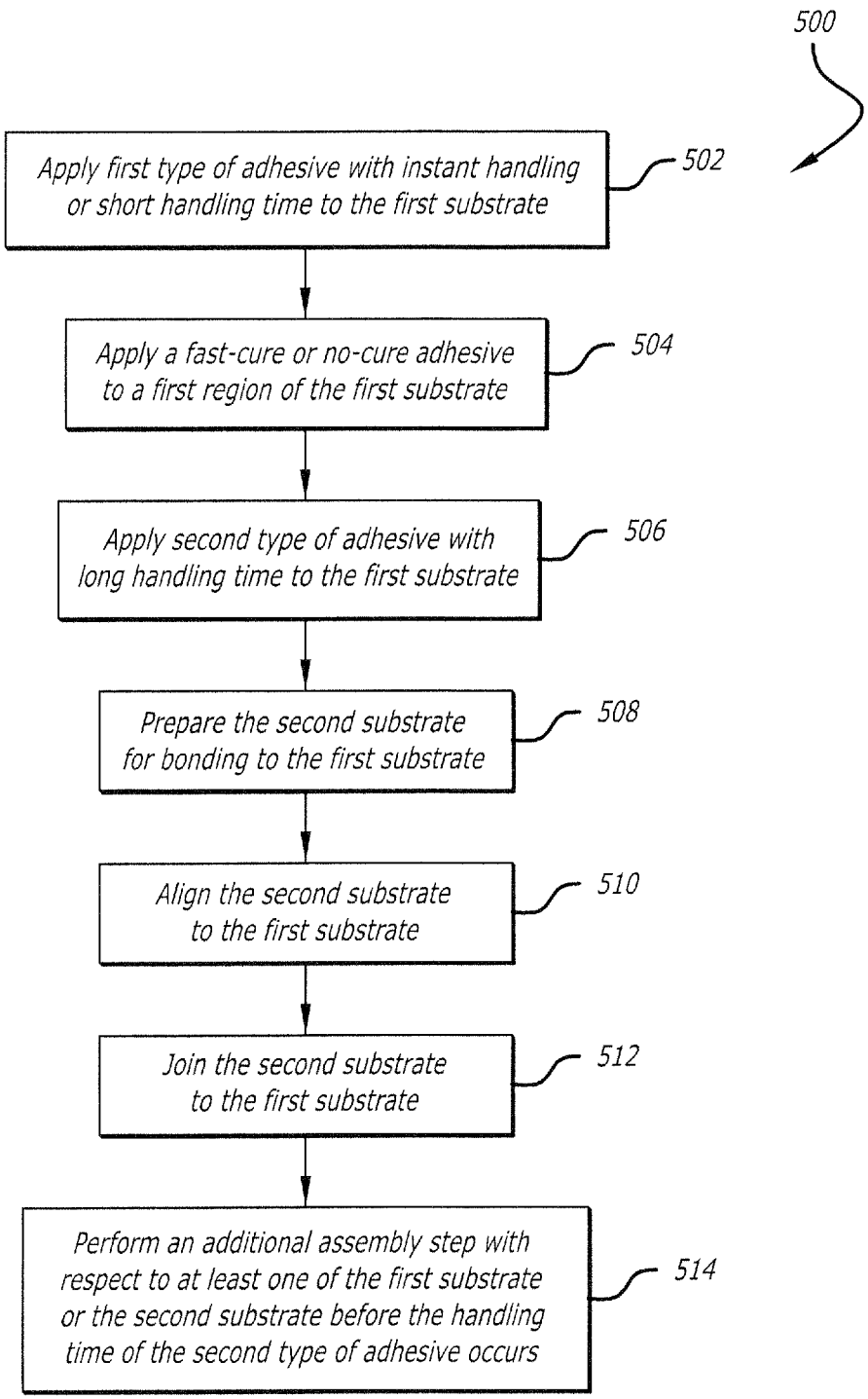
FIG. 5 illustrates an example process for hybrid bonding of substrates of an electronic device that can be used in accordance with an embodiment.

FIG. 5 illustrates an example of a process 500 for assembling an electronic device using hybrid bonding techniques in accordance with an embodiment. In this example, the process may begin by obtaining a first substrate, such as a housing structure of an electronic device, and preparing the first substrate for bonding 502. In an embodiment, the housing structure is placed in a clean room environment to prevent particulates from adhering to the housing, wherein the housing can undergo appropriate cleaning processes and surface treatments, such as Corona treatment or air plasma treatment, atmospheric plasma treatment, flame plasma treatment, chemical plasma treatment, electron-beam (e-beam) irradiation, among others. In other embodiments, the first substrate may comprise a first layer of a touch element (e.g., hybrid bonding for a touch element), a first layer of a display element (e.g., hybrid bonding of a display element), or a cover sheet (e.g., hybrid bonding of a cover sheet to a display and/or touch element).

The process can continue by applying a first type of adhesive that is capable of instant handling or having a short handling time after application, such as a PSA, to first portions of the first substrate (e.g., housing structure, touch element layer, display element layer, cover sheet, etc.) 504. In an embodiment, a double-sided PSA tape is die cut to encompass those regions corresponding to where cameras, infrared sensors and emitters, audio elements (e.g., microphones, speakers), and similar components are positioned on the face of the device and applied to the first substrate or housing structure using automated high-precision machinery.

After the first type of adhesive is applied to the first substrate, a second type of adhesive that is capable of providing a stronger bond than the first type of adhesive but having a longer handling time, such as a liquid adhesive, is applied to the remaining portions where the first substrate be bonded to a second substrate (e.g., cover sheet, touch element layer, display element layer, display and touch assembly) 506. In an embodiment, a liquid adhesive is applied to the first substrate by an automated adhesive dispenser via liquid adhesive beads. In some embodiments, the process can include an active curing step depending on the type of adhesive used. As mentioned, some adhesives are water-based or solvent-based and are cured by drying or evaporating the water or solvent, respectively. Some adhesives can be cured by exposure to ambient humidity, UV radiation, ambient oxygen, or via exclusion of oxygen. In other embodiments, there is no active curing step upon application. For example, multi-component adhesives and hot melts will harden after a determined period of time following application of these types of adhesives.

The process can continue by obtaining the second substrate, such as a display/touch assembly (i.e., bonded cover sheet, touch element, and display element), and preparing the second substrate for bonding to the first substrate or housing structure 508. In an embodiment, appropriate cleaning processes and surface treatments can be performed on the display/touch assembly in a clean room environment. The second substrate can be aligned to the first substrate 510 and joined to the first substrate with a light amount of pressure 512 using automated high-precision machinery. The first type of adhesive holds the substrates (e.g., bonded cover sheet, touch element, display element, front housing structure, etc.) in place and additional manufacture processing steps can be performed on the substrates before the handling time for the second type of adhesive occurs 514, such as mounting a PCB, cameras, light sensors, IR detectors and emitters, and other components, interconnecting the display and touch elements to the PCB, mounting the front housing assembly to a back housing assembly, among other possibilities. Upon completion of the assembly and after the second type of adhesive has fully cured, the assembly benefits from the bond strength of the second type of adhesive.

In other embodiments, the adhesive layer can be applied to the second substrate and the first substrate can be aligned and joined to the second substrate. In still other embodiments, the PSA can be applied to one substrate and the liquid adhesive can be applied to the other substrate before the substrates are joined. Various other combinations and possibilities will be apparent to one of ordinary skill in the art in view of the disclosure herein.

Figure 6:
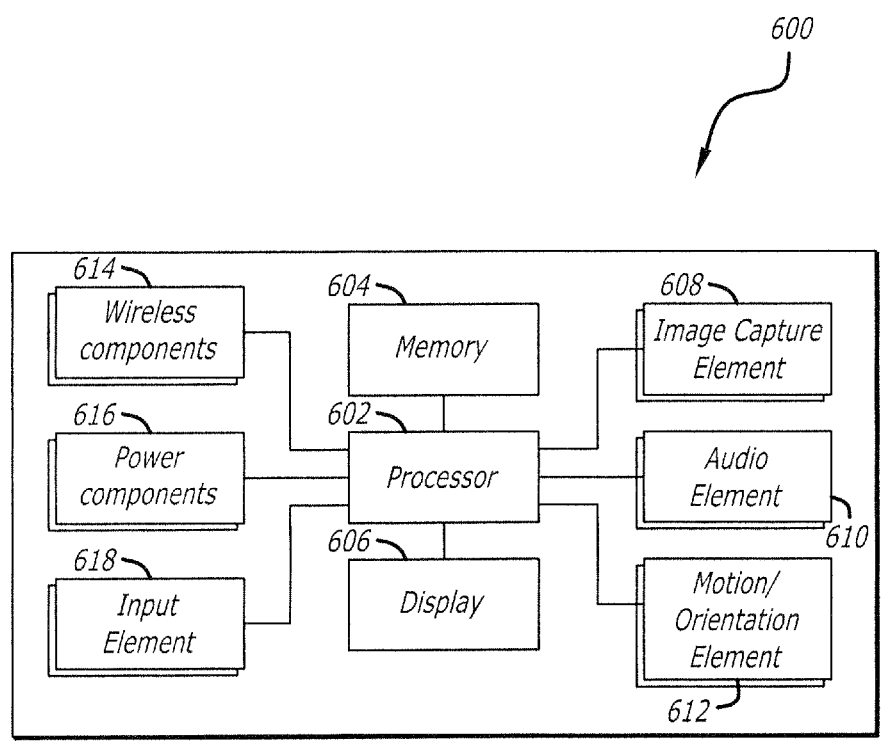
FIG. 6 illustrates an example set of components that can be utilized in a device such as that illustrated in FIG. 1.

FIG. 6 illustrates a logical arrangement of a set of general components of an example computing device 600 such as the device 100 described with respect to FIG. 1. In this example, the device includes a processor 602 for executing instructions that can be stored in a memory component 604. As would be apparent to one of ordinary skill in the art, the memory component can include many types of memory, data storage, or non-transitory computer-readable storage media, such as a first data storage for program instructions for execution by the processor 602, a separate storage for images or data, a removable memory for sharing information with other devices, etc. The device typically will include some type of display element 606, such as an LCD, OLED, e-ink, etc., although devices such as portable media players might convey information via other means, such as through audio speakers. In at least some embodiments, the display element provides for touch or swipe-based input using, for example, resistive, capacitive, surface acoustic wave, or infrared touch technology. The device in many embodiments will include one or more cameras or image sensors 608 for capturing image or video content. A camera can include, or be based at least in part upon any appropriate technology, such as a CCD or CMOS image sensor having a sufficient resolution, focal range, viewable area, to capture an image of the user when the user is operating the device. An image sensor can include a camera or infrared sensor that is able to image projected images or other objects in the vicinity of the device. Methods for capturing images or video using a camera with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device. The example device can similarly include at least one audio component 610, such as a mono or stereo microphone or microphone array, operable to capture audio information from at least one primary direction. A microphone can be a uni- or omni-directional microphone as known for such devices.

The computing device 600 includes at least one capacitive component or other proximity sensor, which can be part of, or separate from, the display element. In at least some embodiments the proximity sensor can take the form of a capacitive touch sensor capable of detecting the proximity of a finger or other such object. The computing device can include one or more communication elements or networking sub-systems 614, such as a Wi-Fi, Bluetooth, RF, wired, or wireless communication system. The device in many embodiments can communicate with a network, such as the Internet, and may be able to communicate with other such devices. The computing device also includes various power components 616 known in the art for providing power to a computing device, which can include capacitive charging elements for use with a power pad or similar device. In some embodiments the device can include at least one additional input element 618 able to receive conventional input from a user. This conventional input can include, for example, a push button, touch pad, touchscreen, wheel, joystick, keyboard, mouse, keypad, or any other such component or element whereby a user can input a command to the device. In some embodiments, however, such a device might not include any buttons at all, and might be controlled only through a combination of visual and audio commands, such that a user can control the device without having to be in contact with the device.

The device 600 also can include one or more orientation and/or motion sensors 612. Such sensor(s) can include an accelerometer or gyroscope operable to detect an orientation and/or change in orientation, or an electronic or digital compass, which can indicate a direction in which the device is determined to be facing. The mechanism(s) also (or alternatively) can include or comprise a global positioning system (GPS) or similar positioning element operable to determine relative coordinates for a position of the computing device, as well as information about relatively large movements of the device. The device can include other elements as well, such as may enable location determinations through triangulation or another such approach. These mechanisms can communicate with the processor 602, whereby the device can perform any of a number of actions described or suggested herein.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for assembling an electronic device, comprising:
   applying a pressure-sensitive adhesive (PSA) to a first region of a front surface of a housing structure of the electronic device, the PSA having a first handling time, the first region corresponding to a location of at least one of a camera, a light sensor, an infrared detector, an infrared emitter, a microphone, a speaker, a biometric scanner, or a button;
   applying a liquid adhesive to a second region of the front surface of the housing structure, the liquid adhesive having a second handling time that is greater than the first handling time;
   aligning a back surface of a display and touch assembly to the front surface of the housing structure, the display and touch assembly including a cover sheet, a touch element, and a display element;
   joining the back surface of the display and touch assembly to the front surface of the housing structure after aligning; and
   mounting at least one of a printed circuit board, the camera, the light sensor, the infrared detector, the infrared emitter, the microphone, the speaker, biometric scanner, or the button to the at least one of the display and touch assembly or the housing structure before the second handling time elapses.

2. The method of claim 1, further comprising:
   curing the PSA or the liquid adhesive by performing one or more of:
      drying the PSA or the liquid adhesive;
      exposing the PSA or the liquid adhesive to ultraviolet radiation;
      exposing the PSA or the liquid adhesive to air;
      placing the PSA or the liquid adhesive in an oxygen-free environment; or
      exposing the PSA or the liquid adhesive to metallic ions.

3. The method of claim 1, further comprising:
   applying the PSA prior to applying the liquid adhesive.

4. A method for assembling an electronic device, comprising:
   applying a first adhesive to a first region of a first substrate, the first adhesive being a pressure-sensitive adhesive having a first handling time, the first region corresponding to a location of at least one of a camera, a light sensor, an infrared detector, an infrared emitter, a microphone, a speaker, or a biometric scanner, or a button;
   applying a second adhesive to a second region of the first substrate, the second adhesive having a second handling time that is greater than the first handling time;
   joining the first substrate to a second substrate; and
   performing an additional assembly step with respect to at least one of the first substrate or the second substrate before the second handling time elapses.

5. The method of claim 4, wherein:
   the first substrate is a cover sheet and the second substrate is a housing structure; or
   the first substrate is the housing structure and the second substrate is the cover sheet.

6. The method of claim 5, further comprising:
   cleaning at least one of the cover sheet or the housing structure prior to applying the first adhesive or the second adhesive; or
   applying at least one of an air plasma treatment, an atmospheric plasma treatment, a flame plasma treatment, a chemical plasma treatment, or electronic-beam irradiation to the housing structure prior to applying the first adhesive or the second adhesive.

7. The method of claim 5, wherein the cover sheet is bonded to at least one of a display element or a touch element prior to applying the first adhesive.

8. The method of claim 4, wherein the second adhesive is a liquid adhesive.

9. The method of claim 4, further comprising:
   curing the first adhesive or the second adhesive, the curing including one or more of:
      drying the first adhesive or the second adhesive;
      exposing the first adhesive or the second adhesive to ultraviolet radiation;
      exposing the first adhesive or the second adhesive to air;
      placing the first adhesive or the second adhesive in an oxygen-free environment; or
      exposing the first adhesive or the second adhesive to metallic ions.

10. The method of claim 4, further comprising:
    die cutting the first adhesive for applying the first adhesive to the first region.

11. The method of claim 4, further comprising:
    applying the first adhesive prior to applying the second adhesive.

12. The method of claim 4, wherein the first substrate and the second substrate are layers of a touch element.

13. The method of claim 4, wherein the first substrate and the second substrate are layers of a display element.

14. The method of claim 4, wherein:
    the first substrate is a cover sheet and the second substrate includes a display and touch assembly; or
    the first substrate includes the display and touch assembly and the second substrate is the cover sheet.

15. The method of claim 4, wherein the additional assembly step includes at least one of mounting a printed circuit board, the camera, the light sensor, the infrared detector, the infrared emitter, the microphone, the speaker, the biometric scanner, the button, or a housing structure to the at least one of the first substrate or the second substrate.

16. A method of assembly, comprising:
    applying a pressure-sensitive adhesive (PSA) to a first portion of a first substrate that forms at least a part of an electronic device, the PSA corresponding to a first period of time by which the PSA satisfies a first curing condition, the first portion corresponding to a location of at least one electronic component that is a camera, a light sensor, an infrared detector, an infrared emitter, a microphone, a speaker, a biometric scanner, or a button;

applying a liquid adhesive to a second portion of the first substrate, the liquid adhesive corresponding to a second period of time, greater than the first period of time, by which the liquid adhesive satisfies a second curing condition;

placing a second substrate that forms at least a part of the electronic device into contact with at least one of the PSA or the liquid adhesive applied to the first substrate; and mounting the electrical component to at least one of the first substrate or the second substrate after the first period of time elapses and before the second period of time elapses.

17. The method of claim 16, wherein applying the PSA to the first portion of the first substrate includes:

placing the PSA into contact with the first portion of the first substrate such that a distance between the first substrate and the second substrate is substantially uniform.

18. The method of claim 16, wherein applying the PSA to the first portion of the first substrate includes:

blocking at least some of the liquid adhesive from flowing into at least one of a display panel, a touch panel, or a backlight of the electronic device.

19. The method of claim 16, further comprising:

shaping the PSA to a specified shape to place into contact with the first portion of the first substrate.

20. The method of claim 16, wherein the first substrate and the second substrate, respectively or irrespectively, form at least a part of: a cover sheet and a housing of the electronic device, a touch panel, a display panel, a cover sheet and a display panel, or a cover sheet and a touch panel.

* * * * *